(12) United States Patent
Reddy

(10) Patent No.: US 7,649,428 B2
(45) Date of Patent: Jan. 19, 2010

(54) METHOD AND SYSTEM FOR GENERATING NOISE IN A FREQUENCY SYNTHESIZER

(75) Inventor: Ajit Kumar Reddy, Matawan, NJ (US)

(73) Assignee: Pine Valley Investments, Inc., Las Vegas, NV (US)

( * ) Notice: Subject to any disclaimer, the term of this patent is extended or adjusted under 35 U.S.C. 154(b) by 169 days.

(21) Appl. No.: 11/717,370

(22) Filed: Mar. 13, 2007

(65) Prior Publication Data
US 2008/0231381 A1    Sep. 25, 2008

(51) Int. Cl.
*H03C 3/06* (2006.01)

(52) U.S. Cl. .................. 332/127; 455/112; 455/113; 455/119; 331/16; 331/34; 331/177 R

(58) Field of Classification Search .............. 331/1 A, 331/16, 25, 34, 177 R; 455/112, 113, 119; 332/127
See application file for complete search history.

(56) References Cited

U.S. PATENT DOCUMENTS

| | | | |
|---|---|---|---|
| 5,952,895 A | 9/1999 | McCune, Jr. et al. | |
| 6,008,704 A * | 12/1999 | Opsahl et al. | 332/127 |
| 6,094,101 A | 7/2000 | Sander et al. | |
| 6,140,882 A | 10/2000 | Sander | |
| 6,255,912 B1 | 7/2001 | Laub et al. | |
| 6,658,748 B1 * | 12/2003 | Leipold et al. | 331/179 |
| 6,813,319 B1 | 11/2004 | Nagle et al. | |
| 7,205,850 B2 * | 4/2007 | Uozumi et al. | 331/23 |
| 2003/0031267 A1 | 2/2003 | Hietala | |
| 2004/0192229 A1 | 9/2004 | Morris et al. | |
| 2004/0196924 A1 | 10/2004 | Wilson | |

* cited by examiner

*Primary Examiner*—Arnold Kinkead
(74) *Attorney, Agent, or Firm*—Allen, Dyer, Doppelt, Milbrath & Gilchrist, P.A.

(57) ABSTRACT

A method and system for generating noise in a frequency synthesizer are provided. The method includes generating a noise portion of an input signal within the frequency synthesizer and appending the noise portion to a control portion of the input signal.

20 Claims, 2 Drawing Sheets

METHOD AND SYSTEM FOR GENERATING NOISE IN A FREQUENCY SYNTHESIZER

BACKGROUND OF THE INVENTION

This invention relates generally to wireless communication systems, and more particularly, to frequency synthesizers for wireless communication systems.

In current wireless communication systems, frequency synthesizers are the core components in the wireless devices. The phase noise performance together with the spurious content of these frequency synthesizers is of considerable importance because these factors have first order effects on the entire transceiver system of the wireless device. Accordingly, creating frequency synthesizers with very low phase noise and spurious content is very important in order to reduce these first order effects.

Fractional-N synthesizers with sigma delta shaping are commonly used in the wireless devices because sigma delta shaping provides the best performance available with integrated frequency synthesizers. In these synthesizers, a phase locked loop (PLL) frequency multiplication is used in which a feedback frequency divider modulus is dynamically adjusted to create an average multiplication factor that can be controlled with precision (much greater than that of the divider modulus). Further, configuring the device as a fractional-N device as compared to an integer N device allows the use of relatively large reference frequencies and PLL bandwidths because instead of providing only multiple integer steps in frequencies, as is the case in traditional synthesizers (e.g., integer-N synthesizer), smaller fractional steps in frequencies may be provided. The smaller steps allow a reference frequency step size to be significantly larger than an output frequency step size such that the loop bandwidth can be increased. Thus, using these fractional-N synthesizers, not only is oscillator noise effectively attenuated, but frequency switching is fast. However, this results in variation of the divider modulus that introduces instantaneous phase noise in the feedback loop, which loop modulates the voltage controlled oscillator (VCO) and accordingly contributes to phase noise. Frequency errors are seen as phase quantization noise that results from the coarse resolution of the divider. Additionally, noise shaping may be provided with a higher order sigma delta modulator that can be used in the control of the divider, which shifts most of the noise quantization energy bandwidth out of the PLL bandwidth. However, this shifting and channel spacing in fractional-N synthesizer introduces fractional spurs that adversely affect the performance of the transceivers.

More particularly, in fractional-N synthesizers spurs appear at phase frequency detector (PFD) offsets from the carrier. Additionally, the spurs also appear at frequencies equal to the channel spacing resolution and may also introduce sub-fractional spurs due to the way the sigma delta is implemented. Harmonics of all of these spurs may also appear. Performance of the system is thereby adversely affected. Thus, a need exists for mitigation of fractional spurs that arise due to the channel spacing or stepping in fractional-N synthesizers.

BRIEF DESCRIPTION OF THE INVENTION

In one embodiment, a method for noise shaping in a frequency synthesizer is provided. The method includes generating a noise portion of an input signal within the frequency synthesizer and appending the noise portion to a control portion of the input signal.

In another embodiment, a frequency synthesizer is provided that includes a phase locked loop having a divider and a frequency modulator connected to the divider. The frequency synthesizer further includes a controller having a noise generator and a code word generator. The controller is configured to append a multibit noise word to an input to the frequency modulator.

In yet another embodiment, a controller for injecting noise into a frequency modulator of a frequency synthesizer is provided. The controller includes a noise generator configured to generate a variable noise portion for an input signal to the frequency modulator and a code word generator configured to generate a fixed code word portion for the input signal to the frequency modulator. The controller further includes a switch operable to select one of the noise generator and the code word generator.

DETAILED DESCRIPTION OF THE INVENTION

For simplicity and ease of explanation, the invention will be described herein in connection with various embodiments thereof. Those skilled in the art will recognize, however, that the features and advantages of the various embodiments may be implemented in a variety of configurations. It is to be understood, therefore, that the embodiments described herein are presented by way of illustration, not of limitation.

Figure 1:
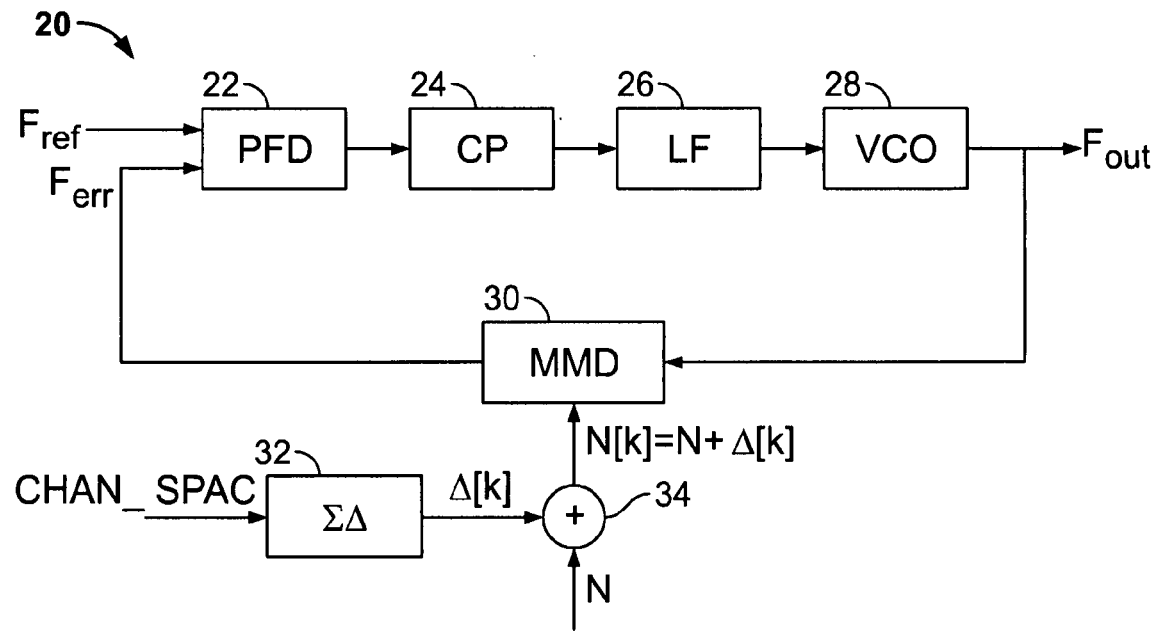
FIG. 1 is a block diagram of a fractional-N frequency synthesizer constructed in accordance with various embodiments of the invention.

Various embodiments of the present invention provide a controller and method for injecting noise into a fractional-N synthesizer. An exemplary fractional-N frequency synthesizer 20 is shown in FIG. 1. The fractional-N frequency synthesizer 20 includes a phase frequency detector (PFD) 22, the output of which is connected to the input of a charge pump (CP) 24. The output of the charge pump 24 is connected to the input of a loop filter (LF) 26. The output of the loop filter 26 is connected to the input of a voltage controlled oscillator (VCO) 28. An output signal $F_{out}$ is generated by the voltage controlled oscillator 28. The output signal $F_{out}$ is also provided to a multi-modulus divider (MMD) 30 that generates feedback to the phase frequency detector 22 and completes a phase locked loop (PLL). A sigma delta ($\Sigma\Delta$) modulator 32 is connected to the multi-modulus divider 30 such that the output of the sigma delta modulator 32 is summed with an integer value (N) by a summer 34 and provided to the multi-modulus divider 30. Accordingly, an integer value is added to the fractional value.

In operation, the fractional-N frequency synthesizer 20 generates a range of frequencies from a single fixed time base or oscillator. The fractional-N frequency synthesizer 20 compares the frequencies of an input reference signal ($F_{ref}$) and an output signal ($F_{out}$) from the voltage controlled oscillator 28, and produces an error signal ($F_{err}$) that is proportional to the difference between the frequencies, for example, at the difference frequency. The error signal ($F_{err}$) is used to drive the voltage controlled oscillator 28 that generates the output signal ($F_{out}$). The output signal ($F_{out}$) having an output frequency is fed through a frequency divider, in this embodiment, the multi-modulus divider 30, back to the input of the fractional-N frequency synthesizer 20 (e.g., back into the phase frequency detector 22) to produce a negative feedback loop. If the output frequency ($F_{out}$) drifts, the error signal ($F_{err}$) will increase, driving the frequency in the opposite direction to reduce the error. Thus, the output is locked to the frequency at the input, and in particular, locked to the frequency of the input reference signal ($F_{ref}$). The frequency of the input signal ($F_{ref}$) may be derived, for example, from a crystal oscillator (not shown).

The multi-modulus divider 30 allows for the generation of multiple frequencies, for example, by continually varying the multi-modulus divider 30 (whereas a standard divider allows for the generation of only a single frequency). This varying of the multi-modulus divider 30 introduces a source of synthesizer phase noise. It should be noted that the instantaneous frequency at the output of the multi-modulus divider 30 has an integer relationship to the frequency of the voltage controlled oscillator 28. Thus, a phase difference between the feedback signal, which is the error signal ($F_{err}$), and the reference frequency signal ($F_{ref}$) exists most of the time. The stream of phase quantization errors drives the phase frequency detector 22 to inject an error signal into the loop filter 26 via the charge pump 24, which produces a load-dependent output voltage. The charge pump 24 is essentially driven by the phase frequency detector 22 (which compares the frequency of the input signal ($F_{ref}$) to the error signal ($F_{err}$)), which in turn drives the loop filter 26. The loop filter 26 smoothes the phase error produced by the phase frequency detector 22 and the charge pump 24. Accordingly, the loop filter 26 extracts the average value and provided that value to the voltage controller oscillator 28. The error signal ($F_{err}$) modulates the frequency of the voltage controlled oscillator 28 and thus produces phase noise, which are small phase perturbations or jitter in the signal. This noise spreads on either side of the main carrier and is referred to as phase noise. Accordingly, the method by which the multi-modulus divider 30 is controlled, as described below, determines the characteristics of the error signal and the effects on the output of the fractional-N frequency synthesizer 20.

The fractional-N frequency synthesizer 20 is essentially a modified integer-N synthesizer where a feedback divider with variable modulus is used, namely the multi-modulus divider 30. In the fractional-N frequency synthesizer 20 the multi-modulus divider 30 is continually varied in a way that allows the average modulus to be specified with sub-integer precision. The increased divider resolution allows the reference frequency ($F_{ref}$) to be significantly larger than the output frequency step size such that the loop bandwidth can also be increased.

The multi-modulus divider 30 provides multiple ratios such that the fraction of the time the multi-modulus divider 30 implements each ratio is weighted to produce a particular average modulus between the multiple ratios and to allow the fractional-N frequency synthesizer 20 to generate, for example, multiples of the input frequencies. For example, in the case of a dual modulus divider the average modulus would be between N and N+1.

Moreover, in operation the sigma-delta modulator 32 provides noise shaping that allows for reducing the amount of quantization noise that appears in the signal bandwidth using a low resolution quantizer (not shown). Essentially, the sigma-delta modulator 32 spectrally shapes the quantization noise such that the energy of the noise appears outside the signal bandwidth where the energy is filtered. The sigma delta modulator 32 controls the multi-modulus divider 30 such that a desired output frequency is obtained while the phase quantization noise energy is moved away from the output frequency. Thus, most of the quantization noise energy is moved outside of the pass-band of the phase locked loop (PLL) of the fractional-N frequency synthesizer 20 such that phase noise is not produced in the synthesizer output.

The sigma delta modulator 32 receives a channel spacing input signal (CHAN_SPAC) that defines the frequency difference between desired or required adjacent frequencies (e.g., frequency steps) and provides delta modulation in any known manner. The sigma delta modulator 32 essentially measures the error of the signal from a feedback, integrates the error and then compensates for the output. The delta modulation provides an analog-to-digital signal conversion in which the analog signal is approximated with a series of segments with each segment compared to the original analog wave to determine an increase or decrease in the relative amplitude. A determination for establishing subsequent states of successive digital bits is determined by the comparison. It should be noted that signal conversion can also be a digital-to-analog signal conversion.

Figure 2:
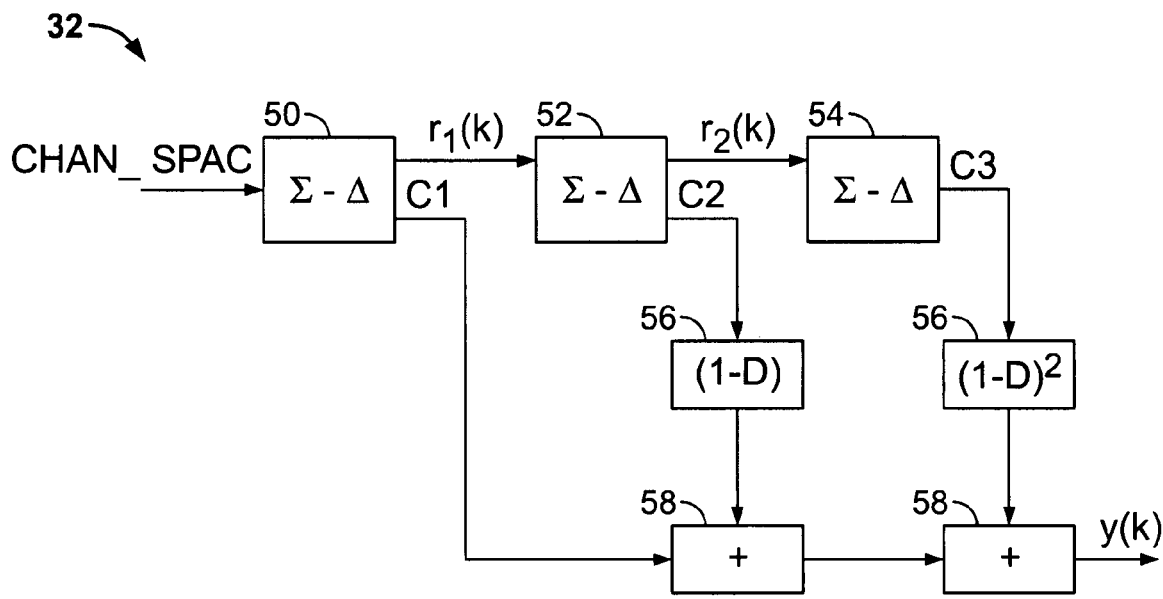
FIG. 2 is a block diagram of a sigma delta modulator constructed in accordance with various embodiments of the invention.

The sigma delta modulator 32 may be provided in different configurations, for example, in a loop configuration or in a multi-stage noise shaping (MASH) configuration. It should be noted that although the sigma delta modulator 32 may be an nth order MASH structure, for example, a 3rd order MASH structure, the configuration may be modified to provide a MASH structure of a different order (e.g., first order, second order, fourth order, etc.). Thus, although the sigma delta modulator 32 shown in FIG. 2 is a 3rd order MASH structure, the configuration may be modified to provide a MASH structure of a different order (e.g., first order, second order, fourth order, etc.). The sigma delta modulator 32 generally includes a first sigma delta ($\Sigma$-$\Delta$) generator 50, a second sigma delta generator 52 and a third sigma delta generator 54. The output of each successive sigma delta generator is increasingly and exponentially delayed by a delay component 56 having a delay factor (1-D), where D is a predetermined delay value. The outputs of each of the first, second and third sigma delta generators 50, 52 and 54 are successively summed by adders 58 to produce from an input signal (CHAN-SPAC), a noise shaped output signal y(k), where $y(k)=C1+C2(1-D)+C3(1-D)^2$ and having a noise transfer function (NTF) defined as follows:

$$H_n(z)=(1-z^{-1})^3, \text{ where } D=z^{-1} \qquad (1)$$

Essentially, the sigma delta modulator 32 shapes the signal noise while not changing the signal. In operation, this shaping is provided by over sampling the signal to reduce noise in a particular frequency band of interest.

Figure 3:
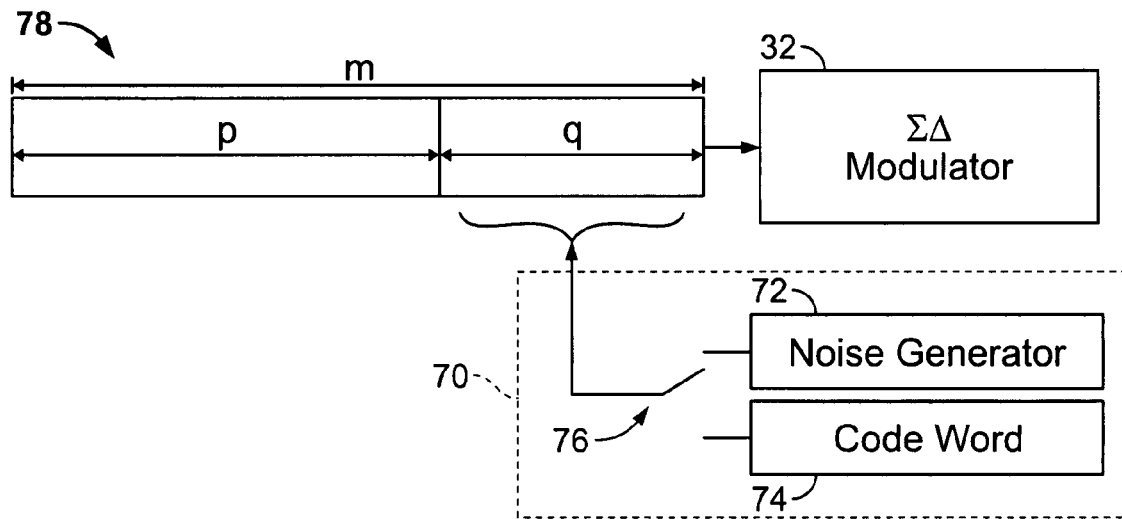
FIG. 3 is a block diagram illustrating a controller constructed in accordance with various embodiments of the invention providing a noise signal to a sigma delta modulator.

In various embodiments, a controller 70 as shown in FIG. 3 for injecting noise into the fractional-N frequency synthesizer 20 via the sigma delta modulator 32 is shown. The controller generally mitigates fractional-N spurs and also suppresses spurs that occur due to offsets of the phase frequency detector 22 from the carrier.

More particularly, the controller 70 uses either a noise generator 72 or a code word generator 74 selected, for example, by a switch 76 to generate a noise portion of an input 78. In this embodiment, the input 78 (e.g., input signal) to the sigma-delta modulator 32 defines the channel spacing or channel stepping frequency with a control portion of the input 78 that is m bits in length (also referenced as CHAN_SPAC in FIGS. 1 and 2). The input 78 is an m bit input word that is split into p bits and q bits such that p+q=m and p>q>0. The p bits define the value of the channel spacing or channel stepping frequency to which is added the q bits that are either word noise generated by the noise generator 72 or a code word (e.g., a fixed code word) from the code word generator 74 that generate noise in conjunction with the sigma delta modulator 32 as described in more detail above.

It should be noted that the word noise or code word is based not only on the m number of bits, but also on the fractional values to be used by the fractional-N frequency synthesizer 20 along with code word to be added as determined by simulation, which is equivalent to the q number of bits. The simulation may be any type of simulation and include testing or other similar methods, for example, based on the operating characteristics and noise requirements for a particular synthesizer or system. For example, one or more MATLAB® simulations (available from MathWorks, Inc.) may be performed in which different parameters (e.g., word length, bid width, band of operation, etc.) are varied. Different noise generation then may be introduced and performance evaluated based on the simulations. The results of the simulation, testing, etc. determine the values for use to generate or define the word noise or code word. Accordingly, the values used to generate the word noise or code word are predetermined or predefined based on simulation, testing, etc. The values may be stored in memory (not shown), for example, as a look up table. These predetermined or predefined values are then later accessed and used as the pulse shaping coefficients.

For example, the CHAN_SPAC signal (shown in FIGS. 1 and 2) may be a signal generated from an m bit register connected to the input of the sigma delta modulator 32 and defines the input 78 (e.g., the m bits input word). To this register, q bits of noise generated by the noise generator 72 or code word generator 74 are added. The q number of bits of noise or code word(s) also may be added as an extension to the m bits input 78 to the sigma delta modulator 32.

In operation, the noise generator 72 may select a fractional value (e.g., a predetermined value based on simulations) from one of plurality of registers (not shown), which is provided as the q bits of the input 78 to the sigma delta modulator 32. A plurality of accumulators (not shown) may be provided to store the input 78 that includes the value of the channel spacing or channel stepping frequency and the fractional value, which may be, for example, up to twenty-four bits in length. The sigma delta modulator 32 then uses this input 78 to perform noise shaping as is known. It should be noted that the sigma delta modulator 32 may include a plurality of delay elements (not shown) to incrementally delay the signal through each stage of the sigma delta modulator 32 and then the output of each stage is summed by summers (e.g., summers 52 shown in FIG. 2) to produce an output signal that is combined with a integer value N for use in controlling the multi-modulus divider 30 (shown in FIG. 1) to thereby generate multiple frequencies using the fractional-N frequency synthesizer 20 (shown in FIG. 1). Alternatively, the code word generator 74 may select a code word (e.g., a predetermined code word based on simulations) from memory (not shown) to add as the q bits to the input signal 78. The determination by the controller 70 to switch between the noise generator 72 and the code word generator 74 may be based on a user input, required operating parameters, simulations, etc.

Thus, the sigma delta modulator 32 may be configured to include a plurality of different stages (defining an nth order structure) each having a different number of delay elements corresponding to the incrementally different delays. The output of each of the accumulators may be delayed and used as a feedback into the accumulators. The delayed output signal also may be provided to accumulators in subsequent stages of the sigma delta modulator 32.

Figure 4:
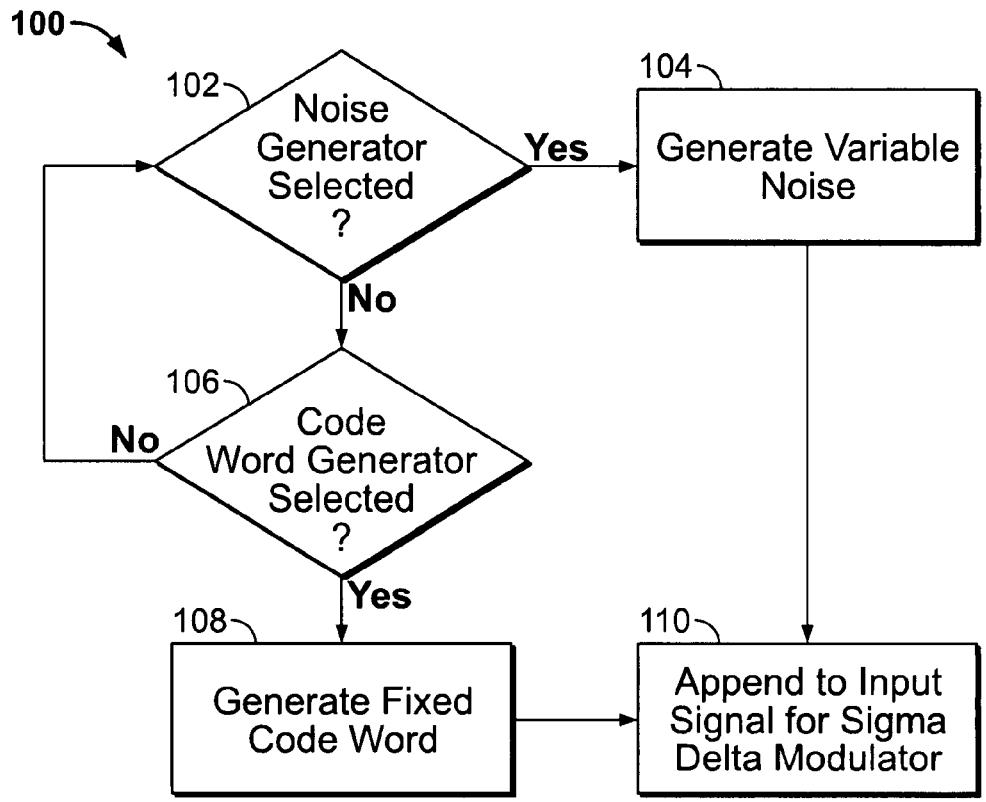
FIG. 4 is a flowchart of a method for injecting noise into a sigma delta modulator in accordance with various embodiments of the invention.

A method 100 for injecting noise into the sigma delta modulator 32 is shown in FIG. 4 and may be controlled, for example, by the controller 70 (shown in FIG. 3). More particularly, at 102 a determination is made as to whether a noise generator has been selected. If a determination is made that the noise generator has been selected then at 104 variable noise is generated. This variable noise generation may be a multiple bit fractional value that includes more than a single bit variation, which may be a predetermined value (e.g., determined from simulations). If at 102 a determination is made that the noise generator has not been selected, then at 106 a determination is made as to whether a code word generator has been selected. If the code word generator has not been selected then a determination is again made at 102 as to whether the noise generator 102 has now been selected.

If at 106 a determination is made that the code word generator has been selected then at 108 a fixed code word is generated, which may be a predetermined value (e.g., determined from simulations). Thereafter, if either the variable noise has been generated at 104 or the fixed code word has been generated at 108 then at 110 either the variable noise or fixed code word, respectively, is appended to an input signal to a sigma delta modulator. For example, the variable noise or fixed code word, which may be a q bit word, is appended to a p bit word that defines a channel spacing or channel stepping frequency value. The q bit word and p bit word then defines an m bit word that is input to the sigma delta modulator. Thus, the q bit word introduces noise into the input of the sigma delta modulator.

Thus, various embodiments of the invention provide a controller and method for the mitigation of fractional spurs that arise due to the channel spacing or stepping in fractional-N frequency synthesizers. The controller and method also may suppress the spurs that arise due to offsets from a phase frequency detector from a carrier.

While the invention has been described in terms of various specific embodiments, those skilled in the art will recognize that the invention can be practiced with modification within the spirit and scope of the claims.

What is claimed is:

1. A method for noise shaping in a frequency synthesizer, said method comprising:

generating a noise portion of an input signal within the frequency synthesizer;

generating a fixed code word portion of the input signal within the frequency synthesizer; and using a switch to append one of the noise portion and the fixed code word portion to a control portion of the input signal.

2. A method in accordance with claim 1 wherein the noise portion and control portion each comprises multibit words.

3. A method in accordance with claim 2 wherein the control portion multibit word is greater in length than the noise portion multibit word.

4. A method in accordance with claim 1 wherein generating the noise portion comprises generating a variable noise value.

5. A method in accordance with claim 4 wherein the variable noise value is a fractional value.

6. A method in accordance with claim 4 further comprising varying the variable noise value by more than one bit.

7. A method in accordance with claim 1 wherein generating the control portion comprises generating a channel spacing or channel stepping frequency value.

8. A method in accordance with claim 1 further comprising providing the input signal to a sigma delta modulator of the frequency synthesizer.

9. A method in accordance with claim 1 wherein the frequency synthesizer comprises a fractional-N frequency synthesizer.

10. A method in accordance with claim 1 wherein the noise portion comprises an extension to the input signal.

11. A frequency synthesizer comprising:
a phase locked loop having a divider;
a frequency modulator connected to the divider; and
a controller comprising a noise generator, a code word generator, and a switch operatively coupled to said noise generator and said code word generator to selectively append a multibit word to an input to the frequency modulator.

12. A frequency synthesizer in accordance with claim 11 wherein the frequency modulator comprises a sigma delta modulator.

13. A frequency synthesizer in accordance with claim 11 wherein the sigma delta modulator is configured in one of a loop configuration and a multi-stage noise shaping (MASH) configuration.

14. A frequency synthesizer in accordance with claim 11 wherein the divider comprises a multi-modulus divider (MMD).

15. A frequency synthesizer in accordance with claim 11 wherein the noise generator is configured to generate a variable noise word and the code word generator is configured to generate a fixed code word.

16. A controller for injecting noise into a frequency modulator of a frequency synthesizer, said controller comprising:
a noise generator configured to generate a variable noise portion for an input signal to the frequency modulator;
a code word generator configured to generate a fixed code word portion for the input signal to the frequency modulator; and
a switch operable to select one of the noise generator and the code word generator.

17. A controller in accordance with claim 16 wherein one of the variable noise portion and the fixed code word portion is appended to a channel spacing or channel stepping frequency value portion of the input signal.

18. A controller in accordance with claim 16 wherein the frequency modulator comprises a sigma delta frequency modulator.

19. A frequency synthesizer in accordance with claim 14 wherein the MMD is continuously varied.

20. A method in accordance with claim 1 wherein the noise portion and the control portion each comprises multibit words and the appending comprises appending the noise portion multibit word to an end of the control portion multibit word.

* * * * *